(12) United States Patent
Sipos et al.

(10) Patent No.: US 10,270,468 B2
(45) Date of Patent: Apr. 23, 2019

(54) METHOD FOR FILE UPDATING AND VERSION CONTROL FOR LINEAR ERASURE CODED AND NETWORK CODED STORAGE

(71) Applicant: Aalborg Universitet, Aalborg (DK)

(72) Inventors: Márton A. Sipos, Budapest (HU); Daniel E. Lucani, Hobro (DK); Janus Heide, Aalborg (DK); Morten V. Pedersen, Aalborg (DK); Frank H. P. Fitzek, Berlin (DE)

(73) Assignee: AALBORG UNIVERSITET, Aalborg (DK)

(*) Notice: Subject to any disclaimer, the term of this patent is extended or adjusted under 35 U.S.C. 154(b) by 0 days.

(21) Appl. No.: 14/973,850

(22) Filed: Dec. 18, 2015

(65) Prior Publication Data

US 2016/0182088 A1    Jun. 23, 2016

Related U.S. Application Data

(60) Provisional application No. 62/094,125, filed on Dec. 19, 2014.

(51) Int. Cl.
| | | |
|---|---|---|
| *H03M 13/00* | (2006.01) | |
| *H03M 13/15* | (2006.01) | |
| *G06F 3/06* | (2006.01) | |
| *G06F 11/10* | (2006.01) | |
| *H04L 29/08* | (2006.01) | |
| *G06F 11/14* | (2006.01) | |
| *G06F 8/658* | (2018.01) | |
| *H03M 13/13* | (2006.01) | |

(52) U.S. Cl.
CPC .......... *H03M 13/154* (2013.01); *G06F 3/064* (2013.01); *G06F 3/067* (2013.01); *G06F 3/0619* (2013.01);
(Continued)

(58) Field of Classification Search
None
See application file for complete search history.

(56) References Cited

U.S. PATENT DOCUMENTS

| 7,251,668 B2 * | 7/2007 | Chen .......................... G06F 8/71 |
| 2002/0078205 A1 * | 6/2002 | Nolan ............... G06F 17/30575 709/225 |

(Continued)

OTHER PUBLICATIONS

PCT International Search Report and Written Opinion dated Jun. 30, 2016 for International Application No. PCT/US2015/066570; 17 Pages.

(Continued)

*Primary Examiner* — Daniel F. McMahon
(74) *Attorney, Agent, or Firm* — Daly, Crowley, Mofford & Durkee, LLP

(57) ABSTRACT

A method for use in a distributed storage system having a plurality of nodes, the method including receiving, at a source node, original data, encoding the original data into plurality of coded fragments using a linear code, transmitting at least a first one of the coded fragments from the source node to a first sink node. The method further includes receiving, at the source node, modified data, calculating, at the source node, a coded difference between the original data and the modified data, transmitting the coded difference from the source node to the first sink node; and recovering, at the first sink node, at least a first portion of the modified data using the coded difference and the at least a first one of the coded fragments.

20 Claims, 6 Drawing Sheets

(52) U.S. Cl.
CPC .......... *G06F 8/658* (2018.02); *G06F 11/1076* (2013.01); *G06F 11/14* (2013.01); *H03M 13/00* (2013.01); *H03M 13/134* (2013.01); *H04L 67/1097* (2013.01); *H03M 13/1515* (2013.01)

(56) References Cited

U.S. PATENT DOCUMENTS

| | | | | |
|---|---|---|---|---|
| 2006/0236319 | A1* | 10/2006 | Pinnix | G06F 8/71 717/170 |
| 2007/0271303 | A1* | 11/2007 | Menendez | G06F 17/2288 |
| 2008/0126440 | A1* | 5/2008 | Dryfoos | G06F 8/71 |
| 2008/0154983 | A1* | 6/2008 | Lee | G06F 17/2288 |
| 2008/0313241 | A1 | 12/2008 | Li et al. | |
| 2013/0086133 | A1* | 4/2013 | Mucklow | G06F 17/3023 707/821 |
| 2013/0275390 | A1* | 10/2013 | Ozzie | G06F 11/1004 707/687 |
| 2014/0317222 | A1* | 10/2014 | Li | H04L 67/1097 709/213 |

OTHER PUBLICATIONS

PCT Invitation to Pay Additional Fees and Partial International Search Report dated Mar. 22, 2016 corresponding to International Application No. PCT/US2015/066570; 6 Pages.

Ahlswede et al., "Network Information Flow;" Proceedings of the IEEE Transactions on Information Theory; vol. 46, No. 4; Jul. 2000; 13 Pages.

Dimakis et al., "Ubiquitous Access to Distributed Data in Large-Scale Sensor Networks Through Decentralized Erasure Codes;" Proceedings of the Fourth International Symposium on Information Processing in Sensor Networks (IPSN); Jan. 2005; 7 Pages.

Dimakis et al., "Network Coding for Distributed Storage Systems;" Proceedings of the IEEE Transactions on Information Theory; vol. 56, No. 9; Sep. 2010; 13 Pages.

Lei et al., "NCStorage: A Prototype of Network Coding Based Distributed Storage Systems;" Proceedings of the TELKOMNIKA Indonesian Journal of Electrical Engineering; vol. 11, No. 12; Dec. 2013; 10 Pages.

Le et al., "NC-Audit: Auditing for Network Coding Storage;" Proceedings of the International Symposium on Network Coding (NetCod); Jan. 2012; 6 Pages.

Sipos et al., "Distributed Cloud Storage Using Network Coding;" Proceedings of the IEEE 11$^{th}$ Consumer Communications and Networking Conference (CCNC); Jan. 2014; 6 Pages.

Heide et al., "Network Coding for Mobile Devices—Systematic Binary Random Rateless Codes;" Proceedings of the IEEE International Conference on Communications Workshops; ICC Workshops 2009; Jun. 2009; 6 Pages.

Ho et al., "A Random Linear Network Coding Approach to Multicast;" Proceedings of the IEEE Transactions on Information Theory; vol. 52, No. 10; Oct. 2006; 18 Pages.

PCT International Preliminary Report on Patentability of the ISA for PCT Appl. No. PCT/US2015/066570; 11 pages.

\* cited by examiner

METHOD FOR FILE UPDATING AND VERSION CONTROL FOR LINEAR ERASURE CODED AND NETWORK CODED STORAGE

CROSS REFERENCE TO RELATED APPLICATION

This application claims the benefit under 35 U.S.C. § 119(e) of U.S. Provisional Application No. 62/094,125 filed Dec. 19, 2014, which application is incorporated herein by reference in its entirety.

BACKGROUND

As is known in the art, distributed storage has attracted interest from both industry and researchers as a flexible, cost-efficient, high performance, and potentially secure solution for geographically distributed data centers, edge caching or sharing storage among users. Distributed storage systems are designed to store data reliably over long periods of time using a collection of storage nodes which are individually unreliable. Different techniques are known for achieving reliability in such a system. A simple approach is to replicate data across multiple nodes, however this approach can be inefficient in terms of network data transfer and storage space.

Some distributed and cloud storage solutions rely on erasure codes to provide high reliability while reducing the overall storage space. Erasure codes allow a distributed storage system to split a packet in multiple fragments, encode them, and spread the coded fragments across nodes, delivering the same or better reliability than data replication but with less redundancy (i.e., storage space) than simple replication. One of the challenges with erasure codes is that redundancy must be refreshed as storage nodes fail, requiring large data transfers to occur across the network.

In this context, distributed and cloud storage utilizing network codes has shown a large potential for trading off storage cost and network use for repairing lost fragments of data as well as a flexible mechanism to update storage conditions and requirements on-the-fly.

SUMMARY

It is recognized herein that, although it is known to use network codes and erasure codes for distributed storage, existing systems fail to provide efficient techniques for updating coded fragments. For example, in some existing systems, when any portion of a file is changed (e.g., when bits have been changed, added, or removed from a file), the entire file must be recoded and all coded fragments must be transmitted through the network, placing a large strain on the network. This problem may be compounded if several versions of a file need to be maintained. Although the difference between the original and the modified data can be stored using less space in an unencoded form, this approach lacks the benefits offered by coding and does not allow for a seamless update of the file without first decoding the original file to later apply the history of changes.

Other storage systems, such as systems that use RAID, provide limited update capability by only allow files to be appended to. Here, changing a file requires storing not only the original file, but also storing additions to the file at separate locations. This results in high storage usage over time and complicates data access.

Described herein are systems and techniques that exploit the linear operations of erasure codes to provide an efficient means to update coded fragments in the network without sending the original data and without sending all coded fragments. Moreover, the disclosed systems and techniques allow for the efficient implementation version control within coded storage systems while reducing the network use and storage use of the system overall. The disclosed systems and techniques support parts of files being added, deleted, or individual bytes being modified. Further, the disclosed systems and techniques can be utilized in distributed storage and cloud systems linear erasure codes and is fully compatible with random linear network codes and other network code variants. The systems and techniques can be used to provide storage for data centers and also to exploit multiple cloud storage providers and/or locations simultaneously, as the cost for sending a new fully coded packet is high, both in network use and storage.

According to one aspect of the disclosure, a method is provided for use in a distributed storage system having a plurality of nodes. The method comprises: receiving, at a source node, original data; encoding the original data into plurality of coded fragments using a linear code; transmitting at least a first one of the coded fragments from the source node to a first sink node; receiving, at the source node, modified data; calculating, at the source node, a coded difference between the original data and the modified data; transmitting the coded difference from the source node to the first sink node; and recovering, at the first sink node, at least a first portion of the modified data using the coded difference and the at least a first one of the coded fragments.

With this particular arrangement, a technique to efficiently update coded fragments seamlessly and without requiring a full upload of a new coded fragment is provided. The technique provides file updating for distributed storage performed using linear codes, such as network codes and random linear network coding (RLNC). The technique further allows for efficient implementation of version control (i.e., maintaining backup versions of files) while relying on efficient representations of the evolution of the data.

In some embodiments of the method, encoding the original data comprises encoding the original data using a linear network code. The method may further include transmitting additional ones of the coded fragments from the source node to a first sink node and, at the first sink node, jointly decoding the coded difference and the additional ones of the coded fragments to recover all of the modified data. In certain embodiments, the method further comprises storing, at the first sink node, the at least a first one of the coded fragments and the coded difference.

In various embodiments, calculating a coded difference between the original data and the modified data comprises remapping the original data to replace occurrences of a special value with a different value. Calculating the coded difference between the original data and the modified data may comprise replacing deleted data elements with the special value. Transmitting the coded difference from the source node to the first sink node may include transmitting an index within the original data where a first data element is inserted and transmitting a number of data elements inserted. The method may further include storing, at the first sink node, the index within the original data with the first data element is inserted and the number of data elements inserted.

In some embodiments, the method further includes: transmitting at least a second one of the coded fragments from the source node to a second sink node; transmitting the coded difference from the source node to the second sink node; and recovering, at the second sink node, at least a second portion of the modified data using the coded difference and the at least a second one of the coded fragments.

In certain embodiments of the method, calculating a coded difference between the original data and the modified data may include transforming the original data to group together changes. In some embodiments, transmitting the coded difference from the source node to the first sink node may include compressing the coded difference.

According to another aspect of the disclosure, a method for use in a version control system comprises: receiving a first file version; storing a representation of the first file version to a storage device; receiving a second file version; calculating a coded difference between the first and second file versions using a linear code; storing the coded difference between the first and second file versions to the storage device; and in response to receiving a request to retrieve the second file version: retrieving the representation of the first file version from the storage device; retrieving the coded difference between the first and second file versions from the storage device; and applying the coded difference between the first and second file versions to the representation of the first file version to generate a copy of the second file version.

In some embodiments, storing a representation of the first file version comprises storing a plaintext representation of the first file version. In certain embodiments, storing a representation of the first file version comprises: encoding the first file version into plurality of coded fragments using the linear code; and storing the plurality of coded fragments to the storage device.

In particular embodiments, the method further comprises: receiving a third file version; storing a representation of the third file version to the storage device; calculating a coded difference between the third and second file versions using a linear code; and storing the coded difference between the third and second file versions to the storage device. The method may also include, in response to receiving a request to retrieve the second file version: retrieving the representation of the third file version from the storage device; retrieving the coded difference between the third and second file versions from the storage device; and applying the coded difference between the third and second file versions to the representation of the third file version to generate a copy of the second file version.

According to yet another aspect of the disclosure, a method for use in a version control system may include: receiving a first file version; storing a representation of the first file version to a storage device; receiving a second file version; storing a representation of the second file version to a storage device; calculating a coded difference between the second and first file versions using a linear code; storing the coded difference between the second and first file versions to the storage device. The method may further include, in response to receiving a request to retrieve the first file version: retrieving the representation of the second file version from the storage device; retrieving the coded difference between the second and first file versions from the storage device; and applying the coded difference between the second and first file versions to the representation of the second file version to generate a copy of the first file version.

In some embodiments, storing a representation of the first/second file version comprises storing a plaintext representation of the first/second file version. In various embodiments, storing a representation of the second file version comprises: encoding the second file version into plurality of coded fragments using the linear code; and storing the plurality of coded fragments to the storage device.

BRIEF DESCRIPTION OF THE DRAWINGS

The concepts, systems, and techniques sought to be protected herein may be more fully understood from the following detailed description of the drawings, in which.

The drawings are not necessarily to scale, or inclusive of all elements of a system, emphasis instead generally being placed upon illustrating the concepts, systems, and techniques sought to be protected herein.

DETAILED DESCRIPTION

Before describing embodiments of the concepts, systems, and techniques sought to be protected herein, some terms are explained. A "network" is made up of a plurality of processing sites generally referred to as "stations" or "nodes" connected by one or more physical and/or logical connections. When the connections enable transmission of a signal between the nodes, the connections are generally referred to as "links". As used herein, a link may be unidirectional (i.e. transmission of a signal in one direction between the nodes) or bidirectional (i.e. transmission of signals in both direction between the nodes).

Each node typically performs a switching function and one or more additional functions. The nodes may be coupled together in a variety of different network structures typically referred to as "network topologies." For example, network nodes may be coupled in so-called mesh topologies, ring (or circular) topologies, star topologies and tree topologies. Other topologies are also known.

The transmission of a signal from a first or source node to a second or receiver node may involve the transmission of the signal through one or more intermediate links and nodes coupled between the source node and the receiver node. Such a succession of links and nodes between a source node and a receiver node is referred to as a path.

The terms "source" and "source node" are used herein to refer to a node in a network that transmits (or sends) packets (referred to as "source packets") to one or more other nodes via one or more links in the network. The terms "sink, "sink node," "receiver," and "receiver node" are used herein to refer to a node in a network that receives packets through a link in the network.

The term "symbol" is used herein to refer to a unit of data transmitted through a network, such as a packet of data. It should be understood that the concepts, systems, and techniques described herein are not limited to any particular symbol sizes, data dimensions, or data formats. The terms "fragment" and "symbol" may be used synonymously herein.

The term "field size" refers to the order of a finite field (sometimes referred to as a "Galois field"). The notation GF(n) refers to a finite field of size n.

Figure 1:
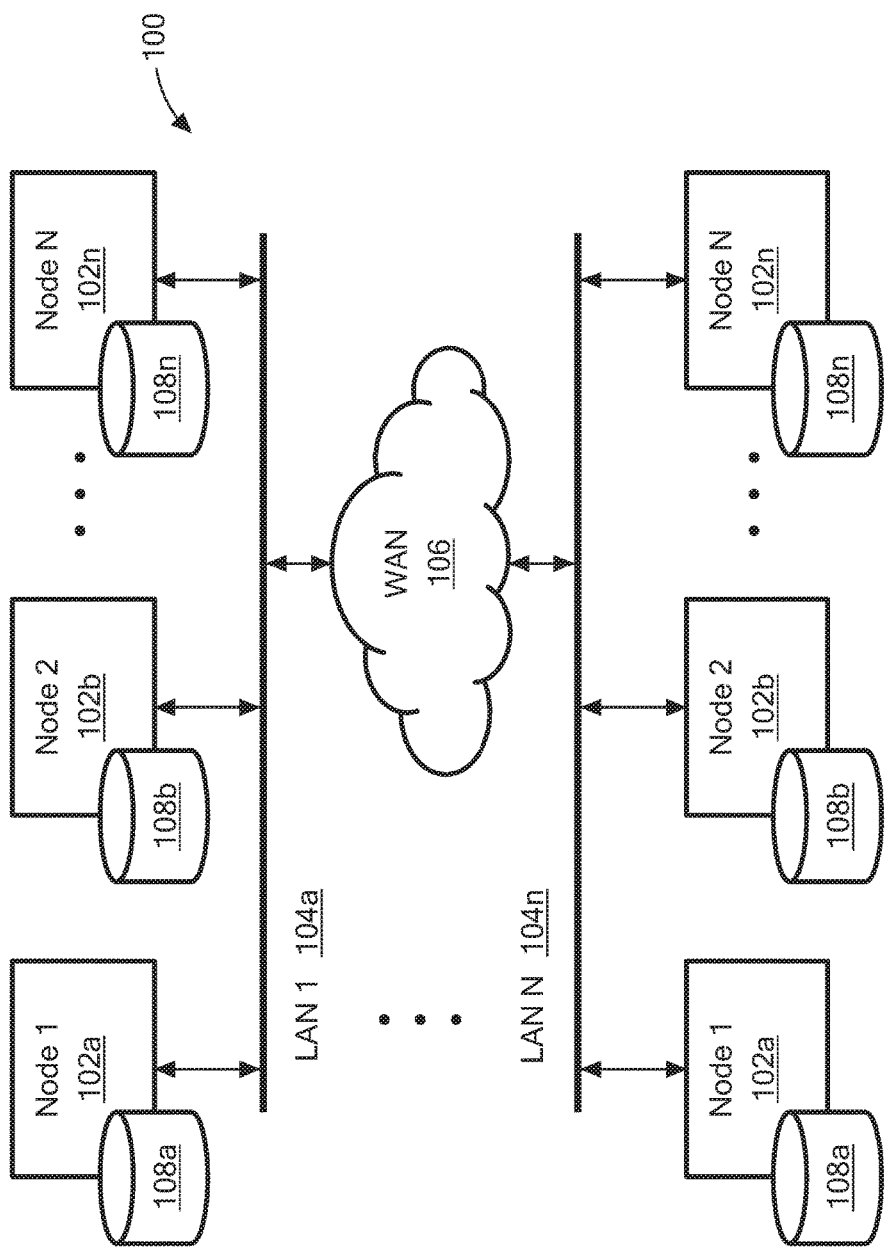
FIG. 1 is a block diagram of an illustrative distributed storage system configured to efficiently update coded fragments within a network environment.

Referring to FIG. 1, a distributed storage system 100 is shown within an illustrative network environment. The illustrative distributed storage system 100 comprises a plurality of storage nodes 102a ... 102n (generally denoted 102). In this example, each storage node 102 is connected to a respective one of a plurality of local-area networks (LANs) 104a ... 104n (generally denoted 104), which may be interconnected via wide-area network (WAN) 106 such as the Internet.

A given LAN 104 may correspond to an Ethernet network, a WiFi network, a cellular network, or any other suitable type of network. In some embodiments, a given LAN and the storage nodes 102 connected thereto correspond to a cloud storage provider. Thus, it will be appreciated that a distributed storage system 100 can span multiple clouds, thereby providing improved performance, reliability, data availability, and other advantages. In various embodiments, at least one LAN 104 and the corresponding storage nodes 102 are collocated within a data center.

The storage nodes 102a ... 102n may include, or otherwise have read/write access, to a respective storage devices 108a ... 108n (generally denoted 108). The storage devices 108 may be provided as hard disk drives, flash drives or other non-volatile memory, network attached storage (SAN), disk arrays, or any other suitable type of storage. The storage devices 108 may be operable to store arbitrary-sized chunks of data, which may correspond to files or fragments thereof (including coded file fragments).

In operation, user applications (or "users") can issue commands to read and write data to the distributed storage system 100. From a user's perspective, data may be written and read as files, objects, streams, messages, etc. For simplicity of explanation, user data will be described below in terms of files, although the concepts, systems, and techniques sought to be protected herein are not limited to file-based applications.

Since individual storage devices 108 and/or individual storage nodes 102 are assumed to be unreliable, meaning they may not provide a sufficiently high level of data availability for a given application or use case, user data is stored across one or more of the storage devices 108. In addition to storing new files, users can issue commands to modify existing files. In general, there are three types of modifications: (1) changing data elements within a file without increasing the file's size (e.g., replacing N elements with N different elements); (2) adding elements to the file, thereby increasing the file size; and (3) removing elements from the file decrease its size.

As used herein, the term "data element" (or "element") refers to an arbitrary unit of data within a file, such as a bit, a byte, a word, etc.

In various embodiments, storage nodes 102 utilize a coding technique to generate a plurality of coded fragments (or "packets") from a single file. For example, a storage node 102 may split the file into a plurality of fragments and then use linear network coding to generate a plurality of coded fragments as linear combinations thereof. The coded fragments may then be transmitted to various nodes 102 for storage. If the file is subsequently modified, the coded fragments must be updated on the respective nodes 102. Advantageously, nodes of the system 100 utilize techniques described herein below to efficiently update the coded fragments without requiring the entire modified file to be encoded and transmitted through the network.

Consider a file with data M having elements taken from a given Galois Field GF(q). A user can issue a command to an arbitrary storage node 102 to store the file. The node 102 that processes the write command divides the original file into multiple fragments and encodes the fragments (e.g., using a linear erasure code or linear network code in GF(q)) into coded fragments X using a series of coding vectors (sometimes referred to as "coefficient vectors") V to generate the coded data. The coded fragments are then transmitted to and stored within one or more different nodes 102.

It is recognized herein that when the file is modified to M', it is inefficient and unnecessary to transmit all coded fragments for M' through the network. Instead, a storage node 102 can calculate and transmit information that describes the coded difference between the original file M and the modified file M'. The general approach that can be used is to create coded symbols that contain the differences for each symbol of encoded data and only sending the coded symbols over the network to the respective storage nodes (or "sinks") 102. In turn, a sink node 102 can use relatively simple computations to apply the encoded differences to update the stored data to reflect the changes that were made. The encoded differences can also be stored at the sink nodes 102 and thus multiple versions of files can be stored in a storage-efficient manner.

In some embodiments, the source node 102 may compress the encoded differences to reduce (and ideally minimize) the amount of information transmitted through the network. To increase the effectiveness of compression algorithms, the source node 102 may transform the order in which data is stored. For example, a source node may align data in such a way that modifications bundled together in the original data only affect parts of the coded difference symbols. This minimizes the number of non-zero elements in these symbols.

In certain embodiments, the source node 102 may assign a special value (e.g., zero, although the choice is arbitrary) to signal deletion of data in the original file M. To be able use the chosen value for this purpose, it must not be present in the original data. Thus, the system 100 may utilize a reversible technique that removes all occurrences of the special value from the data by remapping it to different value.

Figure 1A:
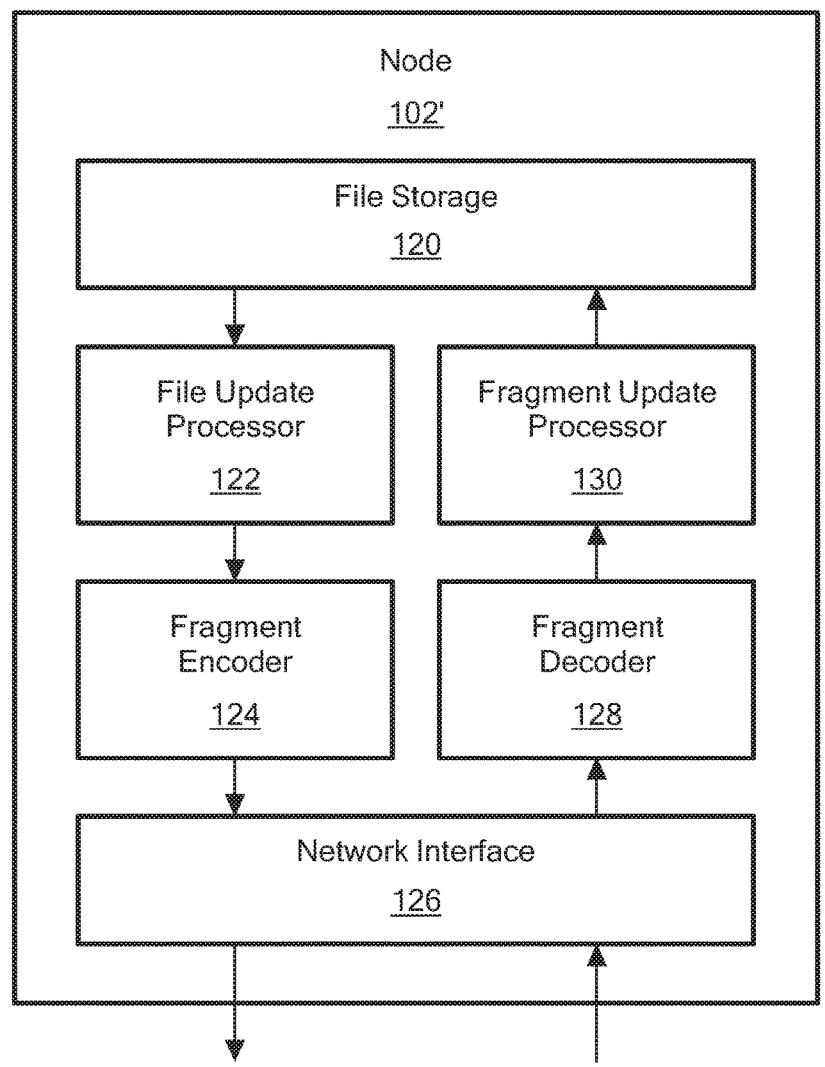
FIG. 1A is a block diagram of an illustrative storage node that may form a part of a distributed storage system.

FIG. 1A shows a storage node 102' that may be the same as or similar to a storage node 102 of FIG. 1. The illustrative storage node 102' includes file storage 120, a file update processor 122, a fragment encoder 124, a network interface 126, a fragment decoder 128, and a fragment update processor 130. The various components 120-30 may be provided from any suitable combination of hardware and/or software configured to perform the functions described herein.

File storage 120 provides read and write access to files, file fragments, and coded file fragments stored upon a storage device (e.g., a storage device 108 of FIG. 1). The network interface 126 provides network transmit and receive capability and may be coupled, for example, to a local area network 104 of FIG. 1.

When a file is updated within file storage 120, the file update processor 102 may compare the contents of the original file with that of the modified file to determine whether (1) existing data elements were modified within the file, (2) data elements were deleted from the file, and/or (3) data elements were added to the file.

Depending on the type of change, the fragment encoder 124 can utilize an appropriate processing technique to calculate a coded difference between the files. In particular, if data elements were modified (1), the fragment encoder 124 may utilize processing show in FIG. 2A and described below; if data elements were deleted (2), the fragment encoder 124 may utilize processing show in FIG. 2B and described below; and if data elements were added (3), the fragment encoder 124 may utilize processing show in FIG. 2C and described below.

The coded fragments may be transmitted to one or more other storage nodes via the network interface 126, where they are received and decoded by the fragment decoder 128. As with the fragment encoder 124, the fragment decoder 128 employs various different processing (also described below in conjunction with FIGS. 2A-2C) depending on the type of change to the file (which may be signaled along with the coded packets). The fragment update processor 130 may store the decoded file fragments within the receiving node's local file storage 120 and/or may apply the fragments to previously received data to recover the modified data.

Figure 2A:
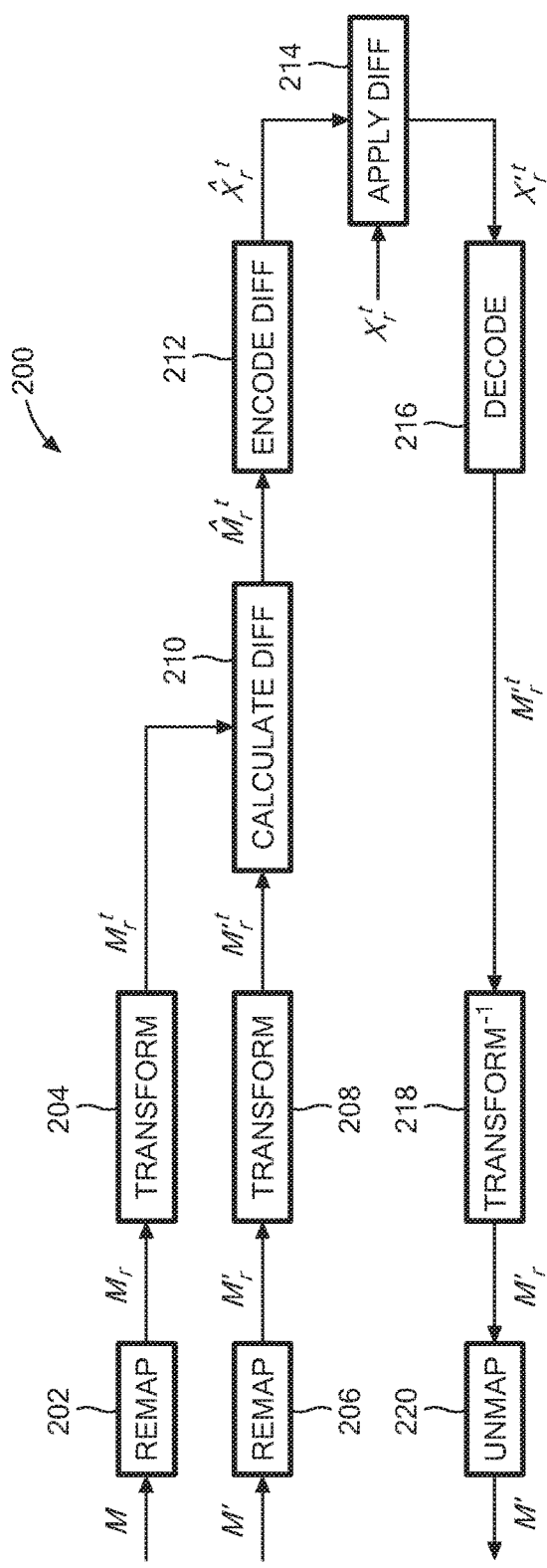
FIGS. 2A-2C are flow diagrams of illustrative processes that can be used to efficiently update coded fragments within the distributed storage system of FIG. 1.
Figure 2B:
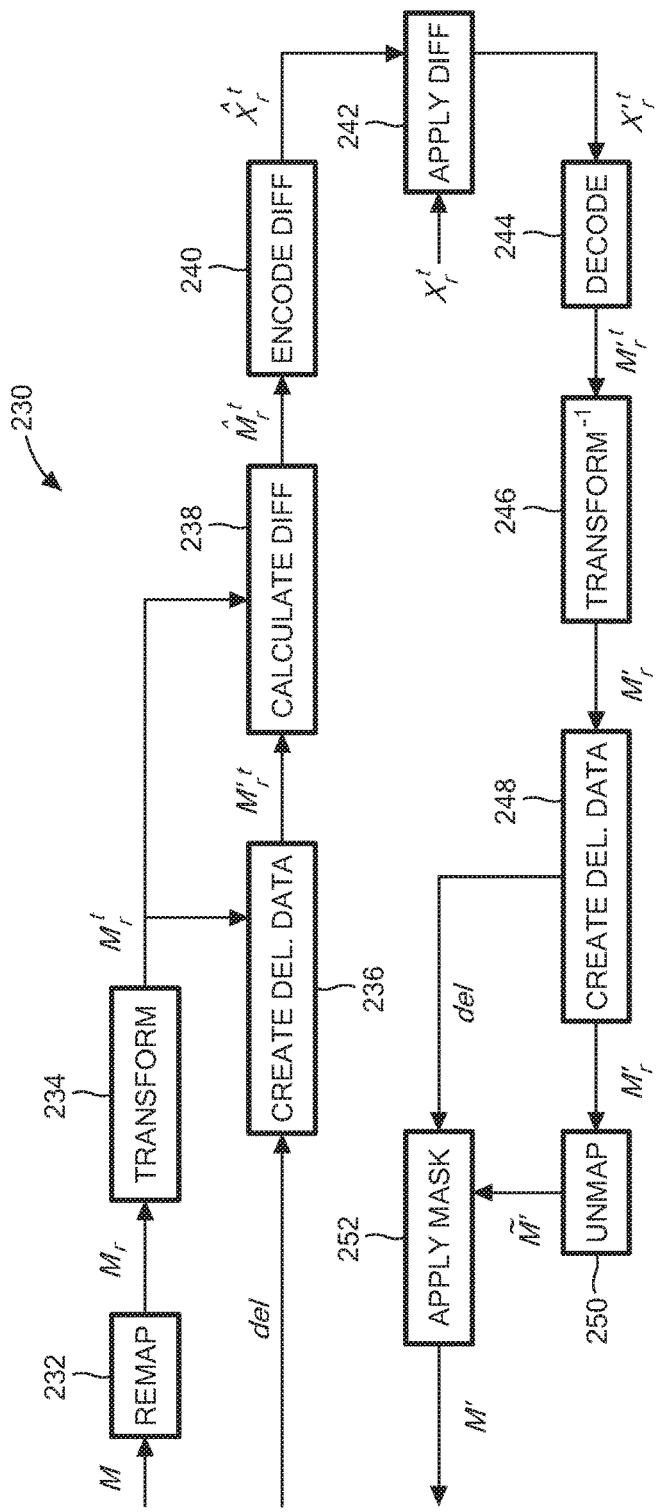
Figure 2C:
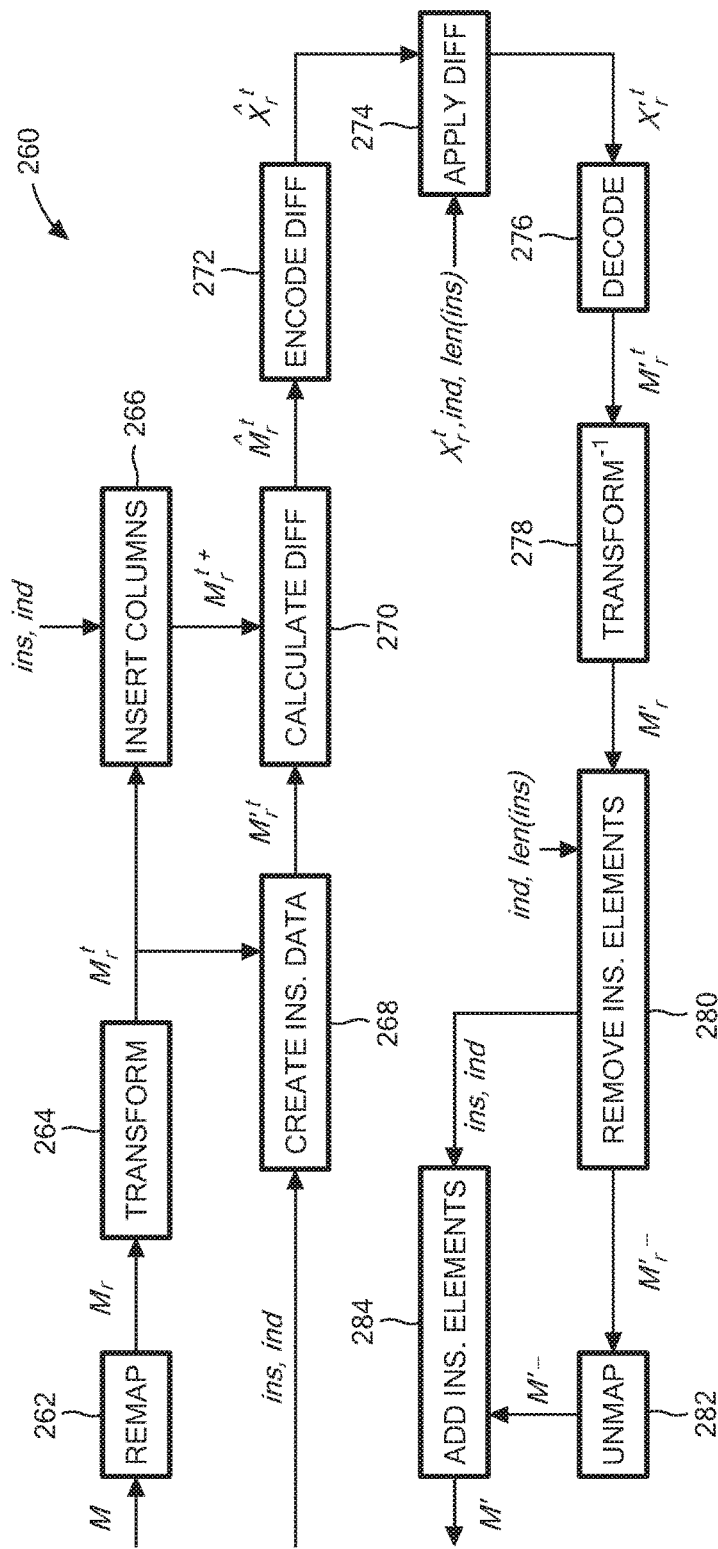

FIGS. 2A-2C, which are described herein below, show illustrative processes for file updating in a distributed storage system using linear codes, such as erasure codes (e.g., Reed-Solomon), network codes, and random linear network coding (RLNC). The various processes of FIGS. 2A-2C may be implemented within one or more nodes of a distributed storage system, such as distributed storage system 100 of FIG. 1.

Rectangular elements (typified by element 202 in FIG. 2A), herein denoted "processing blocks," represent computer software instructions or groups of instructions. Alternatively, the processing and decision blocks may represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the concepts, systems, and techniques sought to be protected herein. Thus, unless otherwise stated the blocks described below are unordered meaning that, when possible, the functions represented by the blocks can be performed in any convenient or desirable order.

Before describing FIGS. 2A-2C in detail, some notation is explained:

M denotes original data, which may be organized as a matrix;
M' denotes modified data, which may also be organized as a matrix;
$\hat{M}$ denotes the difference between original and modified data, i.e. $\hat{M}=M'-M$;
V denotes a matrix defined by one or more coding vectors (e.g., vectors of coefficients used for linear network coding);
X denotes an encoded representation of original data;
X' denotes an encoded representation of modified data;
$\hat{X}$ denotes the coded difference between original and the modified data: $\hat{X}=X'-X$;
del denotes a vector of deleted indexes;
ins denotes a vector of elements to be inserted;
ind denotes the location (e.g., index) within the original data where the vector of elements is to be inserted;
$A^t$ denotes a transformed version of a given matrix A (e.g., $M^t$ denotes a transformed version of original data M);
$A_r$ denotes a remapped version of a given matrix A (e.g., $X_r$ denotes a remapped version of original encoded data X);
$\tilde{A}$ denotes a version of a given matrix A that may contain invalid elements (e.g., elements that should be deleted);
$A^+$ denotes a version given matrix A that contains extra columns; and
$A^-$ denotes a version matrix A that has had a sequence of its elements removed.

Using the above notation, the following operations can be defined (in the following equations it should be appreciated that M and/or M' can be replaced with remapped and/or transformed versions of the same):

$X = M \cdot V$—encoding original data;

$X' = M' \cdot V$—encoding modified data;

$\hat{X} = \hat{M} \cdot V$—encoding the difference between original and modified data;

$\hat{M} = M' - M$—calculating the difference between original and modified data; and $\hat{X} = X' - X = (M' - M) \cdot V$—calculating the coded difference between original and modified data.

FIG. 2A shows an illustrative process 200 that may be used when modifying elements within original data M. As used herein, "modifying elements" refers to changing existing elements in the data and does not involve deleting or adding new elements, therefore the size of the data remains unchanged.

The original data M includes an arbitrary number of elements taken from a given finite field (e.g., GF(3)). The original data elements can be partitioned into one or more so-called "fragments" that can be arranged in matrix form. The source can generate (or otherwise obtain) one or more coding vectors $v_1$, $v_2$, $v_3$, etc. each having elements drawn from the same finite field. The coding vectors can be arranged as columns within the matrix V (e.g., V=[$v_1$; $v_2$; . . . ]). The coding vector elements may be selected randomly or using any suitable technique.

It is assumed that, prior to process 200 being performed, a given sink node has received one or more coded fragments corresponding to the original data M. The sink node is also assumed to have knowledge of the coding vectors V.

The process 200 may receive as inputs original data M and modified data M'. At block 202, the original data M is remapped to produce $M_r$. In some embodiments, remapping involves using a reversible technique to remove occurred of special values from the original data. Using zero as an arbitrary choice for the special value, remapping can be expressed as:

$$M = (m_1 \quad m_2 \quad \ldots \quad 0 \quad \ldots \quad 0 \quad \ldots \quad m_{255} \mid m_{256} \quad \ldots \quad 0 \quad \ldots)$$

$\downarrow$ $$M_r = (\alpha \quad m_1 \quad m_2 \quad \ldots \quad \alpha \quad \ldots \quad \alpha \quad \ldots \quad m_{255} \mid \beta \quad m_{256} \quad \ldots \quad \beta \quad \ldots)$$

TABLE 1 shows an illustrative implementation of remapping that may be used within processing block 202 and/or processing block 206. The implementation removes the special value (here, zero) from a vector of bytes and substitutes it with values that are not present in the input data ("original").

TABLE 1

```
1:  procedure REMAP(original)
2:    for each 255 long block of original do
3:      unused_symbol ← find a symbol between 0..255, which ∉ block
        save the unused_symbol as the remapping element
4:      result[block_begin + block_ctr · 256] ← unused_symbol
        remap the zero values to the remapping element
5:      for i ← 0 to len(block) do
6:        if block[i] = 0 then
7:          result[block_begin + block_ctr · 256 + i + 1] ← unused_symbol
8:        else
9:          result[block_begin + block_ctr · 256 + i + 1] ← original[block_begin + i]
10:       end if
11:     end for
12:     block_ctr ← block_ctr + 1
13:   end for
14:   return result
15: end procedure
```

Still referring to TABLE 1, each block in the remapped data starts with a remapping element that stores the value that was used to substitute the special values (zero in this example) with. This is followed by a limited number of data elements (e.g., bytes). For example, in the case of $GF(2^8)$ data, the remapping element may be followed by at most 255 bytes of data. In general, if the field of size q is used, each block of remapped data can include at most q−1 symbols where each symbol has a size of at most $\lceil \log_2 q \rceil$ bits. This corresponds to the maximum number of individual values that can be represented by the remapping byte minus 1, guaranteeing that there will be at least one value between, for example, 0 and 255 that does not appear in that block. The technique also works with elements smaller or larger than a byte. The maximum amount of data in each block is the amount of values that can be represented by the remapping element minus 1. For example, by using 16 bit values, the maximum number of elements in each block increases from $2^8-1=255$ to $2^{16}-1=65535$. It will be appreciated that the larger the size of the elements, the lower the overhead of the remapping element. As a result, fewer bytes need to be added on each fragment. For example, for $GF(2^8)$, one byte is required for every 255 bytes, whereas for $GF(2^{16})$ two bytes are required for every 131,070 bytes.

Once the data is remapped, the special value can be used for signaling purposes. For example, as described further below, the special value can be used to identify deleted elements when transmitting an encoded difference.

Still referring to FIG. 2A, at block 204, the remapped data $M_r$ may undergo a transformation procedure, resulting in $M_r^t$. In various embodiments, the transformation changes the order of elements to make them align in a particular way when arranged in vector or matrix form. The goal is to be able to represent changes that are grouped together more efficiently.

The remapped data $M_r$ can be represented as a matrix (e.g., a two-dimension array), where the number of rows corresponds to the number of symbols and the number of columns corresponds to the size of a symbol. The matrix is referred to as "incomplete" because the last row may have fewer elements compared to other rows.

The transformation procedure described herein is similar to a matrix transposition, but with special processing to account for a potentially incomplete last row. Placing elements that were close to each other in the original matrix in the same column or in adjacent columns in the transformed matrix ensures that any changes made to data that is close to each other will only affect the encoded difference in a localized manner. The illustrative transformation procedure may be expressed as follows, wherein k represents a number of symbols and s represents the size of a symbol.

$$M_r = \begin{pmatrix} m_1 & m_2 & \cdots & \cdots & m_s \\ m_{s+1} & m_{s+2} & \cdots & \cdots & m_{2s} \\ \vdots & \vdots & \vdots & \ddots & \vdots \\ m_{(k-2)\cdot s+1} & \cdots & \cdots & \cdots & m_{(k-1)\cdot s} \\ m_{n-l} & \cdots & m_n & & \end{pmatrix} \rightarrow$$

$$M_r^t = \begin{pmatrix} m_1 & m_{k+1} & \cdots & \cdots & m_{n-k+1} \\ m_2 & m_{k+2} & \cdots & \cdots & \vdots \\ \vdots & \vdots & \vdots & \ddots & \vdots \\ m_{k-1} & \cdots & \cdots & \cdots & m_n \\ m_k & \cdots & m_{l\cdot k} & & \end{pmatrix}$$

TABLE 2 shows an illustrative implementation of a transformation procedure that may be used within processing block 204 and/or processing block 208. The input "original" may be provided as a two-dimensional array of data elements.

TABLE 2

```
1:  procedure TRANSFORM(original, symbol_size)
    // current_element is the index of the data to be copied
2:    current_element ← 0
    // calculate the length of the last row
3:    last_row_length ← len(original) mod symbol_size
4:    for i ← 0 to len(original) do
5:      result[i] ← original[current_element]
6:      if (i + 1) mod symbol_size > last_row_length then
7:        offset ← 1
8:      else
9:        offset ← 0
10:     end if
11:     current_element ← current_element + offset
12:     if (i + 1) mod symbol_size = 0 then
13:       current_element ← (i + 1) / symbol_size
14:     end if
15:   end for
16:   return result
17: end procedure
```

At blocks 206 and 208, the modified data M' may be similarly remapped and transformed to produce $M'_r{}^t$. In some embodiments, the processing of blocks 206 and 208 is the same as or similar to that of blocks 202 and 204 as described above.

At block 210, the difference between $M_r^t$ and $M_r'^t$ is calculated as $\hat{M}_r^t = M_r'^t - M_r^t$. In vector form, the difference between original data X and modified data X' can be calculated by performing XOR on their elements individually as follows.

$X = (x_2 x_2 \ldots x_n)$ XOR $X' = (x'_1 x'_2 \ldots x'_n)$ $\hat{X} = (x_1 \oplus x'_1, x_2 \oplus x'_2, \ldots x_n \oplus x'_n)$ TABLE 3 shows an illustrative implementation of processing may be used with block 210, where the arguments "original" and "changed" may correspond to $M_r^t$ and $M_r'^t$, respectively, in vector form.

TABLE 3

| 1: | procedure CALCULATE DIFF(original, changed) |
|---|---|
| 2: | for i < len(original) do |
| 3: | difference[i] F original[i] XOR changed[i] |
| 4: | end for |
| 5: | return difference |
| 6: | end procedure |

At block 212, the difference $\hat{M}_r^t$ may be encoded using the coding vectors V as $\hat{X}_r^t = \hat{M}_r^t \cdot V$. Any suitable coding technical can be used, including linear network coding or random linear network coding (RLNC). It will be appreciated that the encoded difference $\hat{X}_r^t$ may comprise one or more coded fragments.

The coded fragments $\hat{X}_r^t$ can be transmitted from the source node to one or more sink nodes, with different coded fragments being sent to different sink nodes as appropriate. A given sink node may have previously received coded fragments corresponding to the original data M. These previously received coded fragments are generally denoted X and may be arranged, for example, in matrix form. A sink node, having previously received original coded fragments X and having now received the encoded difference $\hat{X}_r^t$ can recover the modified data M' as follows.

At block 214, the encoded difference $\hat{X}_r^t$ can be applied to the original coded fragments X to generate $X'_r^t$. In various embodiments, the process of applying the difference is the same as, or similar to, that of calculating the difference. Thus, the processing of block 214 may be identical, or similar to, that of block 210 as described above and illustrated in TABLE 3.

At block 216, $X'_r^t$ can be decoded to produce a transformed and remapped version of the modified data as $M'_r^t = X'_r^t \cdot V^{-1}$. Any suitable decoding technique can be used, e.g., Gaussian elimination.

At block 218, an inverse transformation procedure can be applied to the decoded data $M'_r^t$ to produce remapped modified data $M'_r$. This is the reverse operation of the transform routine, as shown in the following equations.

$$M_r''(s, k) = \begin{pmatrix} m_1 & m_2 & \ldots & \ldots & m_s \\ m_{s+1} & m_{s+2} & \ldots & \ldots & m_{2s} \\ \vdots & \vdots & \vdots & \ddots & \vdots \\ m_{(k-2)s+1} & \ldots & \ldots & \ldots & m_{(k-1)s} \\ m_{n-l} & \ldots & m_n & & \end{pmatrix} \rightarrow$$

$$M'_r(s, k) = \begin{pmatrix} m_1 & m_{k+1} & \ldots & \ldots & m_{n-k+1} \\ m_2 & m_{k+2} & \ldots & \ldots & \vdots \\ \vdots & \vdots & \vdots & \ddots & \vdots \\ m_{k-1} & \ldots & \ldots & \ldots & m_n \\ m_k & \ldots & m_{l\cdot k} & & \end{pmatrix}$$

TABLE 4 shows an illustrative implementation of an inverse transformation procedure that may be used within processing block 218.

TABLE 4

| 1: | procedure TRANSFORM$^{-1}$ (transformed, symbol_size) |
|---|---|
| 2: | current_element ← 0 |
|  | // calculate number of columns |
| 3: | symbols = ceil(len(transformed) / symbol_size) |
|  | // calculate length of last row |
| 4: | last_row_length ← len(transformed) mod symbol_size |
| 5: | for i ← 0 block of original do |
| 6: | result[current_element] ← transformed[i] |
| 7: | if (i + 1) mod symbol_size > last_row_length then |
| 8: | offset ← 1 |
| 9: | else |
| 10: | offset ← 0 |
| 11: | end if |
| 12: | current_element ← current_element + symbols − offset |
| 13: | if current_element ≥ len(transformed) then |
| 14: | current_element ← (i + 1) / symbol_size |
| 15: | end if |
| 16: | end for |
| 17: | return result |
| 18: | end procedure |

At block 220, an inverse mapping (or "unmap") procedure can be applied to the remapped modified data $M'_r$ to recover the modified data M'. The inverse mapping procedure may be a reverse of the mapping operation, as follow.

$$M'_r = (\alpha \ m'_1 \ m'_2 \ \ldots \ \alpha \ \ldots \ \alpha \ \ldots \ m'_{255} \mid \beta \ m'_{256} \ \ldots \ \beta \ \ldots)$$
$$\downarrow$$
$$M' = (m'_1 \ m'_2 \ \ldots \ 0 \ \ldots \ 0 \ \ldots \ m'_{255} \mid m'_{256} \ \ldots \ 0 \ \ldots)$$

An illustrative implementation of an inverse mapping procedure in shown in TABLE 5. In this example, the procedure takes a vector of bytes as input and substitutes the special values (e.g., zeros) back into it based on the signaling elements. This procedure can be performed for elements larger or smaller than a byte as well.

TABLE 5

| 1: | procedure UNMAP(remapped) |
|---|---|
| 2: | for each 256 long block of remapped do |
|  | // retrieve the remapped symbol |
| 3: | remapped_symbol ← remapped[begin_block] |
|  | // unmap the remapped values to zero |
| 4: | for i ← 0 to len(block) do |
| 5: | if block[i] = remapped_symbol then |
| 6: | result[block_begin + i − block_ctr − 1] ← 0 |
| 7: | else |

TABLE 5-continued

```
8:         result[block_begin + i – block_ctr – 1] ← remapped[block_begin + i]
9:       end if
10:     end for
11:     block_ctr ← block_ctr + 1
12:   end for
13:   return result
14: end procedure
```

In various embodiments, the processing of blocks 202-212 can be performed at a source node and the processing of blocks 214-220 can be performed at one or more sink nodes.

The process 200 may be better understood using the following simplified example. In this example, it is assumed that coding is performed using a linear erasure code in GF(3), wherein the code has elements –, 0, and + and summation and product operations defined in TABLES 6 and 7, respectively.

TABLE 6

| ⊕ | – | 0 | + |
|---|---|---|---|
| – | + | – | 0 |
| 0 | – | 0 | + |
| + | 0 | + | – |

TABLE 7

| ⊗ | – | 0 | + |
|---|---|---|---|
| – | + | 0 | – |
| 0 | 0 | 0 | 0 |
| + | – | 0 | + |

It is further assumed that, in the following example, the original data M includes twelve (12) elements partitioned into fragments each having four (4) elements. In particular, assume $M_r$ is defined as:

$$M_r = \begin{bmatrix} + & - & - \\ - & - & + \\ + & + & - \\ + & + & - \end{bmatrix}$$

First, the source encodes N symbols that are sent and received by the sink. Here, it assumed that the source encodes two symbols (N=2), however more coded fragments can be generated depending on desired redundancy. The source generates (or otherwise obtains) the following coding vectors $v_1$ and $v_2$, each having three (3) elements, which can be arranged into a matrix as shown in the following example:

$$V = [v_1; v_2]$$
$$= \begin{bmatrix} + & 0 \\ - & + \\ 0 & - \end{bmatrix}$$

Thus, the coded symbols can be calculated as:

$$X = M_r \cdot V$$
$$= \begin{bmatrix} - & 0 \\ 0 & + \\ 0 & - \\ 0 & - \end{bmatrix}$$

It is assumed herein that the sink has knowledge of X prior to execution of process 200 (e.g., the corresponding coded fragments were received from the source node).

Next, on the source side, the original data is updated M→M'≠M, where the update can be expressed as:

$$\hat{M} = M' - M$$

or equivalently:

$$\hat{M}_r = M'_r - M_r$$

For example, assume the following update to the original data (in remapped form) where the change is marked with parentheses:

$$M'_r = \begin{bmatrix} + & - & - \\ - & - & + \\ + & (-) & - \\ + & + & - \end{bmatrix}$$

The source can calculate the update as:

$$\hat{M}_r = \begin{bmatrix} + & - & - \\ - & - & + \\ + & - & - \\ + & + & - \end{bmatrix} - \begin{bmatrix} + & - & - \\ - & - & + \\ + & + & - \\ + & + & - \end{bmatrix} = \begin{bmatrix} 0 & 0 & 0 \\ 0 & 0 & 0 \\ 0 & + & 0 \\ 0 & 0 & 0 \end{bmatrix}$$

It should be appreciated that the update $\hat{M}_r$ could instead be calculated against transformed versions of $\hat{M}_r$ and $M'_r$, for example as shown at block 210 of FIG. 2A.

The source can then either transmit a compressed version of $\hat{M}_r$ to the sink or it can generate coded updates for the two original coded fragments by taking the product of $\hat{M}_r$ and the original coding vectors (which remain unchanged), i.e., $\hat{X} = \hat{M}_r \cdot V$.

Having received the encoded difference X, the sink node can then use then calculate the modified encoded data as:

$$X' = X + \hat{X}$$
$$= \begin{bmatrix} - & 0 \\ 0 & + \\ 0 & - \\ 0 & - \end{bmatrix} + \begin{bmatrix} 0 & 0 & 0 \\ 0 & 0 & 0 \\ 0 & + & 0 \\ 0 & 0 & 0 \end{bmatrix} \cdot \begin{bmatrix} + & 0 \\ - & + \\ + & - \end{bmatrix}$$

$$= \begin{bmatrix} - & 0 \\ 0 & + \\ 0 & - \\ 0 & - \end{bmatrix} + \begin{bmatrix} 0 & 0 \\ 0 & 0 \\ - & + \\ 0 & 0 \end{bmatrix}$$

$$= \begin{bmatrix} + & - & - \\ - & - & + \\ + & (-) & - \\ + & + & - \end{bmatrix}$$

The source can encode and send an additional symbol using a third coding vector $v_3$, for example:

$$x' = M'_r \cdot v_3 = \begin{bmatrix} + & - & - \\ - & - & + \\ + & - & - \\ + & + & - \end{bmatrix} \cdot \begin{bmatrix} - \\ - \\ 0 \end{bmatrix} = \begin{bmatrix} 0 \\ - \\ 0 \\ + \end{bmatrix}$$

The sink can the jointly decode the first two coded update symbols X' and the third coded update symbol x' to decode the updated data.

$$M'_r = [X' | x'] \cdot [V | v_3]^{-1}$$

$$= \begin{bmatrix} - & 0 & 0 \\ 0 & + & - \\ - & 0 & 0 \\ 0 & - & + \end{bmatrix} \cdot \begin{bmatrix} - & + & + \\ 0 & 0 & - \\ + & + & + \end{bmatrix}$$

$$= \begin{bmatrix} + & - & - \\ - & - & + \\ + & - & - \\ + & + & - \end{bmatrix}$$

This, as illustrated by the preceding example, a sink node can produce the updated data without requiring the updated data to be transmitted in full.

FIG. 2B shows an illustrative process 230 that may be used when deleting elements from original data M. As used herein, the phrase "deleting element" refers to the process of removing an arbitrary number of elements from arbitrary locations in the original data, thereby decreasing the size of the data.

As inputs, the process 230 may receive the original data M and information about the deletes (denoted del). In some embodiments, the delete information del comprises a list of locations (e.g., indexes) within the original data M corresponding to the location of the deleted elements.

At blocks 232 and 234, the original data M may be remapped and transformed to produce $M_r^t$. The processing of blocks 232 and 234 may be the same as, or similar to, that of blocks 202 and 204, respectively, which processing blocks are described above in conjunction with FIG. 2A.

At block 236, deleted data $M'^t_r$ may be generated using the remapped, transformed data $M_r^t$ and the delete information del. In various embodiments, the deleted data $M'^t_r$ is generated by replacing elements of the original data identified by the list of indexes del with a special value (e.g., zero). This processed is illustrated by the following equations wherein elements $m_{d1}$, $m_{d2}$, etc. correspond to the deleted elements.

$$M = (m_1 \; m_2 \; \ldots \; m_{d1} \; \ldots \; m_{d2} \; \ldots)$$
$$\downarrow$$
$$M' = (m'_1 \; m'_2 \; \ldots \; 0 \; \ldots \; 0 \; \ldots)$$

TABLE 8 shows an implementation of a procedure that may be used within block 236. This illustrative procedure creates a version of the input data ("original") having deleted elements replaced with a special value (e.g., zero). It is assumed that the input data has been previously remapped to ensure that it does not contain the special value.

TABLE 8

|   |   |
|---|---|
|   | // del is a list of indexes to be deleted |
| 1: | procedure CREATE DEL. DATA(original, del) |
| 2: | for i ← 0 to len(original) do |
|   | // index may be adjusted for remapping |
| 3: | if adjust_index(i) ∈ del then |
| 4: | result[i] ← 0 |
| 5: | else |
| 6: | result[i] ← original[i] |
| 7: | end if |
| 8: | end for |
| 9: | return result |
| 10: | end procedure |

At block 238, the difference of the deleted data $M'^t_r$ and the remapped, transformed original data $M_r^t$ is calculated, resulting in $\hat{M}_r^t$. At block 240, the difference $\hat{M}_r^t$ may be encoded as $\hat{X}_r^t$ and the resulting coded fragments may be transmitted to one or more sink nodes. The processing of blocks 238 and 240 may be the same as or similar to that of blocks 210 and 212, respectively, of FIG. 2A.

It is recognized herein that it may be possible to calculate the difference $\hat{M}_r^t$ without generating deleted data $M'^t_r$. This can be accomplished, for example, by modifying the removed elements individually, as all other values will correspond to the special value (e.g., zero).

A sink node, having previously received encoded data X and having now received the encoded difference $\hat{X}_r^t$ can recover the modified data M' as follows. At blocks 242-246, the sink node processes the received encoded difference $\hat{X}_r^t$ along with the previously received encoded data X to produce remapped modified data $M'_r$. The processing of blocks 242, 244, and 246 may be the same as or similar to that of blocks 214, 216, and 218, respectively, as described above in conjunction with FIG. 2A.

In contrast to process 200 (FIG. 2A), which handles modifying existing data elements, here the reverse mapping procedure cannot be directly applied to remapped modified data $M'_r$ to recover the modified data M'. Instead, the signaling data applied at the source node (e.g., the special value applied at block 236) must first be removed.

At block 248, a mask of deleted items del is produced from the remapped modified data $M'_r$. In various embodiments, this involves identifying the indices of all special values (e.g., zeros) in the input data as follows, wherein the elements marked for deleting are denoted $m_{d1}$, $m_{d1}$, etc.

$$M = (m'_1 \; m'_2 \; \ldots \; 0 \; \ldots \; 0 \; \ldots)$$
$$\downarrow$$
$$M' = (m'_1 \; m'_2 \; \ldots \; m_{d1} \; \ldots \; m_{d2} \; \ldots)$$

TABLE 9 shows an illustrative implementation that may be used within processing block 248.

TABLE 9

```
1:     procedure CREATE DEL. MASK(original)
2:         delete_count ← 0
3:         for i ← 0 to len(original) do
4:             if original[i] = 0 then
                   // save the deleted index
5:                 result[delete_count] ← i
6:                 delete_count ← delete_count + 1
7:             end if
8:         end for
9:         return result
10:    end procedure
```

At block 250, an inverse remapping routine may be applied to the remapped modified data $M'_r$ to produce a so-called "invalid" version modified data $\tilde{M}'$. The resulting data $\tilde{M}'$ is referred to as "invalid" because it may contain some invalid elements (i.e., elements that were deleted). The processing of block 250 may be the same as or similar to that of block 220 as described above in conjunction with FIG. 2A.

At block 252, the deleted mask del is applied to the "invalid" modified data $\tilde{M}'$ to produce the actual modified data M'. This may involve removing values from the data (in vector form) based on a list of deleted indices, as follows.

$$\tilde{M}' = (m'_1 \ \ldots \ m'_a \ 0 \ m'_{a+1} \ \ldots \ 0 \ \ldots \ m'_b \ 0 \ m'_{b+1} \ \ldots \ m'_n)$$
$$\downarrow$$
$$M' = (m'_1 \ \ldots \ m'_a \quad m'_{a+1} \ \ldots \quad \ldots \ m'_b \quad m'_{b+1} \ \ldots \ m'_n)$$

TABLE 10 shows an illustrative implementation that may be used within processing block 252.

TABLE 10

```
1:     procedure APPLY MASK(original, del)
2:         delete_count ← 0
3:         for i ← 0 to len(original) do
               // index may be adjusted for remapping
4:             if adjust_index(i) ∉ del
                   // copy non-deleted items
5:                 result[i − delete_count] ← original[i]
6:                 delete_count ← delete_count + 1
7:             end if
```

TABLE 10-continued

```
8:         end for
9:         return result
10:    end procedure
```

In various embodiments, the processing of blocks 232-240 is performed at a source node, and the processing of blocks 242-252 is performed at one or more sink nodes.

FIG. 2C shows an illustrative process 260 that may be used when adding elements to original data M. As used herein, the phrase "adding elements" refers to the process of inserting an arbitrary number of elements (e.g., bytes, characters, or other unit of data) into the original data M, thereby increasing the size of the data. As inputs, the process may receive original data M, one or more elements to insert ins and a location ind within the original data where those elements should be inserted. In various embodiments, the insert location ind is an array index.

At blocks 262 and 264, original data M may be remapped and transformed as described above in conjunction with blocks 202 and 204 of FIG. 2A.

At block 266, columns are inserted into the remapped, transformed original data matrix $M_r^t$ to produce $M_r^{t+}$. In some embodiments, the values within inserted columns may be set to a special value (e.g., zero) and elements that are to be overwritten are copied into the last inserted column. The following equations illustrate this procedure, where the insert location is denoted "b."

$$M_r^t(s,k) = \begin{pmatrix} m_1 & \ldots & a & f & \ldots & m_{n-k+1} \\ \vdots & & b & \vdots & & \vdots \\ \vdots & & c & \vdots & & \vdots \\ \vdots & & \vdots & \vdots & & \vdots \\ \vdots & & d & \ldots & \ldots & m_n \\ m_k & \ldots & e & & & m_{l \cdot k} \end{pmatrix} \rightarrow$$

$$M_r^{t+}(s,k) = \begin{pmatrix} m_1 & \ldots & a & \ldots & 0 & f & \ldots & m_{n-k+1} \\ \vdots & & 0 & & b & \vdots & & \vdots \\ \vdots & & 0 & & c & \vdots & & \vdots \\ \vdots & & 0 & & \vdots & \vdots & & \vdots \\ \vdots & & 0 & & d & \ldots & \ldots & m_n \\ m_k & \ldots & 0 & \ldots & e & & & m_{l \cdot k} \end{pmatrix}$$

TABLE 11 shows an illustrative implementation that may be used within processing block 266.

TABLE 11

```
1:  procedure INSERT COLUMNS(original, insertLength, index, symbols)
2:      columns_to_insert ← calculate number of columns to insert using insertLength
3:      for i ← 0 to index do
4:          result[adjust_index(i)] ← original[adjust_index(i)]
5:      end for
6:      for i ← 0 to columns_to_insert · symbols do
            // fill newly inserted columns with zeros
7:          result[adjust_index(index + 1)] ← 0
8:      end for
9:      overwritten_length ← symbols − (index mod symbols)
        // copy elements that are going to be overwritten into the last inserted column
10:     for i ← 0 to overwritten_length do
11:         result[adjust_index(index + columns_to_insert · symbols + i)]
12:             ← original[adjust_index(index + i + overwritten_length)]
13:     end for
14:     return result
15: end procedure
```

At block 268, the remapped, transformed original data $M_r^t$, the insert elements ins, and the insert location ind may be used to produce insert data $M_r'^t$. In various embodiments, this includes: (1) adding padding (e.g., zeros) to the list of insert elements ins so that the data aligns after the insert operation; and (2) copying the padded list of insert elements into the transformed original data $M_r^t$. The following equations illustrate this procedure.

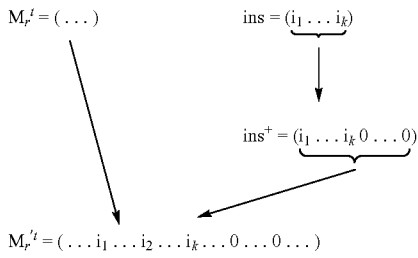

TABLE 12 shows an illustrative implementation that may be used within processing block 268.

TABLE 12

```
// ins is a list (e.g., an array) of elements to insert
// ind is the insert location (e.g., an index)
// symbols is the number of rows
1:  procedure CREATE INS. DATA (original, ins, ind, symbols)
    // pad the ins array with zeros to make its length a multiple of "symbols"
2:    for i ← len(ins) to len(ins) + symbols − (len(ins) mod symbols) do
3:       ins[i] ← 0
4:    end for
    // copy original data elements located before the insert
5:    for i ← 0 to ind do
6:       result[adjust_index(i)] ← original[adjust_index(i)]
7:    end for
    // insert data elements
8:    for i ← ind to len(ins) do
9:       result[adjust_index(i)] ← ins[i]
10:   end for
    // copy original data located after the insert
11:   for i ← ind + len(ins) to len(original) + len(ins) do
12:      result[adjust_index(i)] ← original[adjust_index(i + len(ins))]
13:   end for
14:   return result
15: end procedure
```

At block 270, the difference of the insert data $M_r'^t$ and the remapped, transformed original data $M_r^t$ may be calculated. At block 272, this difference $\hat{M}_r^t$ may be encoded as $\hat{X}_r^t$ and may be transmitted to one or more sink nodes. The processing of blocks 270 and 272 may be the same as or similar to that of blocks 210 and 212, respectively, of FIG. 2A.

In various embodiments, the insert location ind and the number of elements inserted len(ins) are also transmitted from the source node to sink nodes. These values are used as inputs to block 280, as described below. In some embodiments, a sink node may store the insert location ind and the number of inserted elements len(ins) in addition to the encoded difference (e.g., $\hat{X}_r^t$). This allows the sink to be able to successfully apply the encoded difference at later times, which may be a requirement for version control systems.

It is appreciated herein that steps of creating insert data, inserting columns into the original data, and calculating the difference can be performed as part of a single procedure. Thus, for example, two or more of processing blocks 266, 268, and 270 may be combined and/or omitted.

It is also appreciated herein that it may be possible to calculate the difference without creating the inserted data. For example, this can be accomplished by calculating the difference for only the inserted columns and setting all other elements to a special value (e.g., zero). ind A sink node, having previously received encoded data X and having now received the encoded difference $\hat{X}_r^t$, along with insert location ind and the number of elements inserted len(ins), can recover the modified data M' as follows.

At blocks 274, 276 and 278, the sink node processes the received encoded difference along with the previously received encoded to produce remapped modified data $M'_r$. The processing of blocks 274, 276, and 278 may be the same as or similar to that of blocks 214, 216, and 218, respectively, as described above in conjunction with FIG. 2A.

At block 280, the insert location ind and the number of elements inserted len(ins) can be used to remove the inserted elements from the remapped modified data $M'_r$ to produce $M'^{-}$. Processing block 280 may also produce as output the list of inserted elements ins, but without any padding (e.g., zeros) that may have been added by the source. This procedure is illustrated in the following equations.

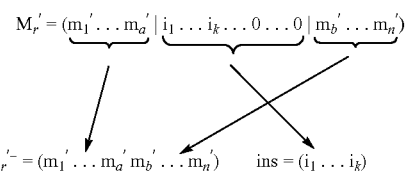

TABLE 13 shows an illustrative implementation that may be used within processing block 280.

TABLE 13

```
1:  procedure REMOVE INS. ELEMENTS (original, ind, length, symbols)
2:    j ← 0
3:    padding ← length mod symbols
4:    for i ← 0 to len(original) do
5:       if i ≥ ind and i < ind + length + padding then
6:          if i < ind + length then
7:             inserted[j] ← original[i]
```

TABLE 13-continued

```
8:         end if
9:            j ← j + 1
10:       else
11:          result[i − j] ← original[i]
12:       end if
13:    end for
14:    return result, inserted
15: end procedure
```

At block 282, remapped modified data (with the inserted elements removed) $M'^-_r$ is "unmapped" to produce $M'^-$. The processing of block 282 may be the same as or similar to the processing of block 220 shown in FIG. 2A and described above in conjunction therewith.

At block 284, the inserted elements ins, which were extracted by processing block 280, may be inserted into $M'^-$ to recover the modified data M'. This operation may be similar to that of block 268. However, whereas block 268 operates on mapped, transformed data, processing block 284 operates on unmapped, untransformed data. In following equations, which illustrate processing that may be performed within block 284, the inserted elements ins are assumed to be inserted at location $m'_b$.

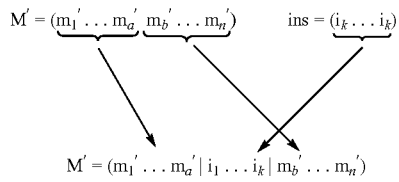

TABLE 14 shows an illustrative implementation that may be used within processing block 284.

TABLE 14

```
1:   procedure ADD INS. ELEMENTS (original, ind, ins)
2:     for i ← 0 to ind do
3:        result[i] ← original[i]
4:     end for
5:     for i ← ind to ind + len(ins) do
6:        result[i] ← ins[i − ind]
7:     end for
8:     for i ← ind + len(ins) to len(original) + len(ins) do
9:        result[i] ← original[i − len(ins)]
10:    end for
11:    return result
12: end procedure
```

Although the concepts, systems, and techniques are described herein in the context of distributed storage systems, it should be appreciated that they may be utilized in other applications, such as massive online multiplayer gaming, version control systems, and various other distributing computing applications.

For example, the techniques described herein can be used to support version control systems with coded storage (i.e., storing data using erasure codes). Version control typically keeps track of the changes to the files and would store those changes. If the version control system is coded (fully or in parts), the goal is to update the coded fragments with minimal overhead, but at the same time store these coded differences between versions so that you have a record of the changes. Thus, the techniques described above for efficiently calculating, storing, and using coded differences are well suited for use in version control systems.

There are several possibilities with how coding is used in a version control system. For example, a system may the original version of a file along with code differences between subsequent versions of the file. If the original version of the file is requested, it can be retrieved "directly" from storage. If a later version of the file is requested, coded differences may be applied to the original version to generate a copy of the latest version. Alternatively, a system may store the latest version of a file along with code differences between previous versions of the file. A hybrid approach is also possible, wherein the system stores the latest version of a file every so often (e.g., after every N updates).

Another consideration is how to store the original/latest version of the file. In some embodiments, original/latest file data can be stored in a completely coded fashion: the system generates and stores coded fragments for the original/latest file version in addition to storing coded updates. This use case is valuable for security/privacy: the coded file fragments can be stored across multiples storage devices such that it is not exposed within any single device. Alternatively, if reliability (but not security/privacy) is the goal, a plaintext representation of the original/latest file version may be stored along with additional coded fragments.

Figure 3:
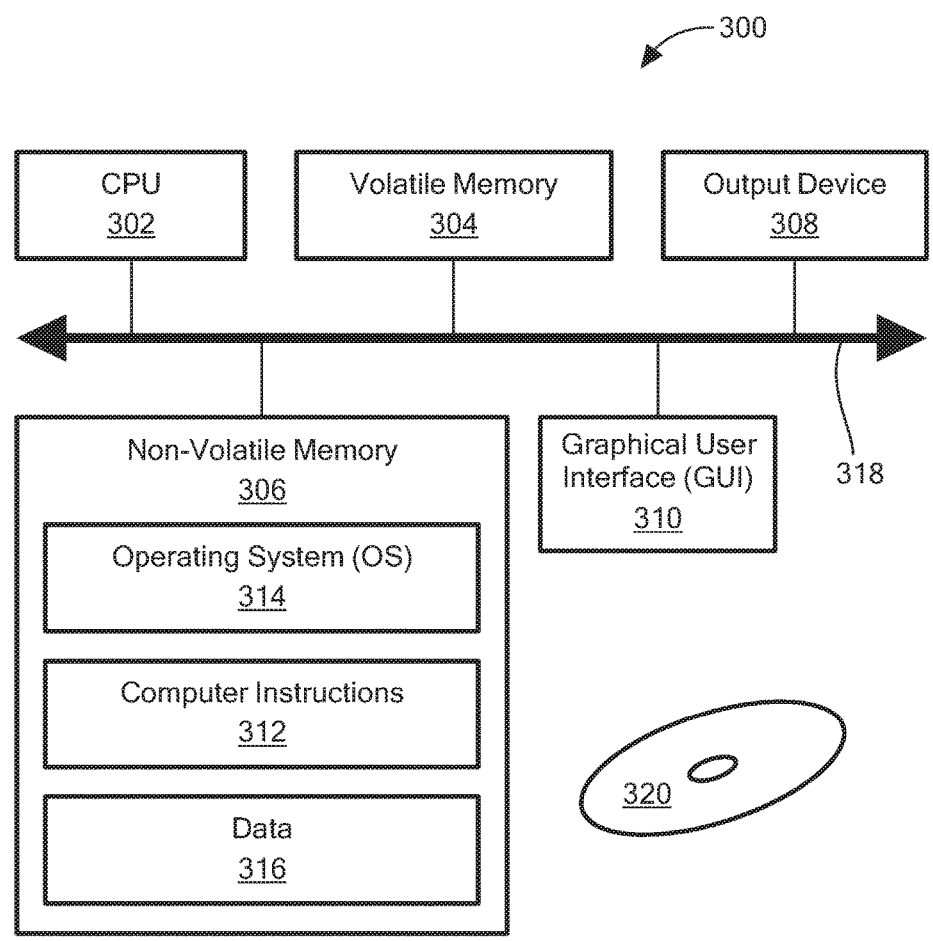
FIG. 3 is a schematic representation of an illustrative computer that may form a part of the distributed storage system of FIG. 1.

FIG. 3 shows an illustrative computer or other processing device 300 that may form a part of a distributed storage system (e.g., system 100 of FIG. 1) and may be configured to perform at least part of the processing described herein (e.g., the processes shown in FIGS. 2A-2C and described above in conjunction therewith). The computer 300 includes a processor 302, a volatile memory 304, a non-volatile memory 306 (e.g., hard disk), an output device 308 and a graphical user interface (GUI) 310 (e.g., a mouse, a keyboard, a display, for example), each of which is coupled together by a bus 318. The non-volatile memory 306 stores computer instructions 312, an operating system 314, and data 316. In one example, the computer instructions 312 are executed by the processor 302 out of volatile memory 304. In one embodiment, an article 320 comprises non-transitory computer-readable instructions.

Processing may be implemented in hardware, software, or a combination of the two. In various embodiments, processing is provided by computer programs executing on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as special purpose logic circuitry (e.g., an FPGA (field programmable gate array) and/or an ASIC (application-specific integrated circuit)).

All references cited herein are hereby incorporated herein by reference in their entirety.

Having described certain embodiments, which serve to illustrate various concepts, systems, and techniques sought to be protected herein, it will be apparent to those of ordinary skill in the art that other embodiments incorporating these concepts, systems, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that scope of protection sought herein should not be limited to the described embodiments but rather should be limited only by the spirit and scope of the following claims.

What is claimed is:

1. A method reducing data storage bandwidth in a distributed storage system having a plurality of nodes, the method comprising:
   receiving original data;
   encoding the original data into a plurality of coded fragments using a linear code;
   transmitting at least one of the coded fragments for storage by a first sink node in the plurality of nodes;
   receiving modified data;
   encoding, using the linear code, a difference between the original data and the modified data as a coded difference; and
   transmitting a fragment of the coded difference toward the first sink node.

2. The method of claim 1 wherein encoding the original data comprises encoding the original data using a linear network code.

3. The method of claim 1 further comprising:
   transmitting additional ones of the coded fragments toward the first sink node; and
   at the first sink node, jointly decoding the coded difference and the additional ones of the coded fragments to recover the modified data.

4. The method of claim 1 further comprising storing, at the first sink node, the at least one of the coded fragments and the fragment of the coded difference.

5. The method of claim 1 wherein encoding the difference between the original data and the modified data comprises remapping the original data to replace occurrences of a special value with a different value.

6. The method of claim 5 wherein encoding the difference between the original data and the modified data comprises replacing deleted data elements with the special value.

7. The method of claim 5 where transmitting the fragment of the coded difference-comprises transmitting an index within the original data where a first data element is inserted and transmitting a number representing the number of data elements inserted.

8. The method of claim 7 further comprising storing, at the first sink node, the index within the original data where the first data element is inserted and the number representing the number of data elements inserted.

9. The method of claim 1 further comprising:
   transmitting at least a second one of the coded fragments for storage by a second sink node; and
   transmitting a second fragment of the coded difference toward the second sink node.

10. The method of claim 1 wherein transmitting the coded difference comprises compressing the coded difference.

11. A method storing different versions of a file with improved resiliency, the method comprising:
    receiving a first file version;
    storing a representation of the first file version to a storage device;
    receiving a second file version;
    encoding a difference between the first file version and the second file version using a linear code as a coded difference; and
    storing the coded difference to the storage device.

12. The method of claim 11 wherein storing a representation of the first file version comprises storing a plaintext representation of the first file version.

13. The method of claim 11 wherein storing a representation of the first file version comprises:
    encoding the first file version into a plurality of coded fragments using the linear code; and
    storing the plurality of coded fragments to the storage device.

14. The method of claim 11 further comprising:
    receiving a third file version;
    encoding a difference between the third file version and the second file version using the linear code as a second coded difference; and
    storing the second coded difference
    to the storage device.

15. The method of claim 12 further comprising, in response to receiving a request to retrieve the second file version:
    retrieving the plaintext representation of the first file version from the storage device;
    retrieving the coded difference from the storage device;
    decoding the coded difference using the linear code to obtain the difference between the first file version and the second file version; and
    generating a copy of the second file version by applying, to the retrieved plaintext representation of the first file version, the obtained difference between the first file version and the second file version.

16. The method of claim 13 further comprising, in response to receiving a request to retrieve the first file version:
    retrieving the plurality of coded fragments from the storage device; and
    generating a copy of the first file version by decoding the plurality of coded fragments using the linear code.

17. The method of claim 13 further comprising, in response to receiving a request to retrieve the second file version:
    retrieving the plurality of coded fragments from the storage device;
    retrieving the coded difference from the storage device;
    obtaining an encoding of the second file version by adding, to the retrieved plurality of coded fragments, the retrieved coded difference; and generating a copy of the second file version by decoding the obtained encoding of the second file version using the linear code.

18. The method of claim 14 wherein storing a representation of the first file version comprises storing a plaintext representation of the first file version, the method further comprising, in response to receiving a request to retrieve the third file version:
  retrieving the plaintext representation of the first file version from the storage device;
  retrieving the coded difference from the storage device;
  retrieving the second coded difference from the storage device;
  obtaining an encoding of a difference between the first file version and the third file version by adding the coded difference to the second coded difference;
  decoding the obtained encoding using the linear code, to produce the difference between the first file version and the third file version; and
  generating a copy of the third file version by applying, to the retrieved plaintext representation of the first file version, the produced difference between the first file version and the third file version.

19. The method of claim 14 wherein storing a representation of the first file version comprises storing to the storage device an encoding of the first file version using the linear code as a plurality of coded fragments, the method further comprising, in response to receiving a request to retrieve the third file version:
  retrieving the plurality of coded fragments from the storage device;
  retrieving the coded difference from the storage device;
  retrieving the second coded difference from the storage device;
  obtaining an encoding of the third file version by adding the plurality of coded fragments, the coded difference, and the second coded difference; and
  generating a copy of the third file version by decoding the obtained encoding of the third file version using the linear code.

20. A method of reducing data storage bandwidth in a distributed storage system having a plurality of nodes, the method comprising:
  receiving original data;
  encoding, by at least one processor, the original data into a plurality of coded fragments using a linear code;
  transmitting, over a communications network, at least one of the coded fragments to a first sink node in the plurality of nodes;
  receiving modified data;
  generating, by the at least one processor, a coded difference between the original data and the modified data, the generating including obtaining an incomplete matrix $M_r^t$ that is generated by re-mapping the original data, obtaining an incomplete matrix $M'^t_r$ that is generated by re-mapping the modified data, subtracting the matrix $M'^t_r$ from the matrix $M_r^t$ to produce a difference matrix $\hat{M}_r^t$, and encoding the difference matrix $\hat{M}_r^t$ by using the linear code to yield the coded difference between the original data and the modified data; and
  transmitting, over the communications network, at least one fragment of the coded difference to the first sink node.

* * * * *